US006144329A

United States Patent [19]

[11] Patent Number: 6,144,329

[45] Date of Patent: Nov. 7, 2000

Mahant-Shetti et al.

[54] APPARATUS AND METHOD FOR PROCESSING ANALOG SIGNALS USING RESIDUE-BASED DIGITAL OPERATIONS

[75] Inventors: Shivaling Mahant-Shetti, Garland, Tex.; Venu Gopinathan, Basking Ridge, N.J.

[73] Assignee: Texas Instruments Incorporated, Dallas, Tex.

[21] Appl. No.: 09/092,691

[22] Filed: Jun. 5, 1998

Related U.S. Application Data

[60] Provisional application No. 60/048,950, Jun. 6, 1997.

[51] Int. Cl.[7] ..................... H03M 1/12

[52] U.S. Cl. ..................... 341/155

[58] Field of Search ..................... 341/158, 110, 341/155, 159

[56] References Cited

U.S. PATENT DOCUMENTS 4,814,767 3/1989 Fernandes et al. ..................... 341/158

OTHER PUBLICATIONS van Valburg et al., "An 8–b 650–MHz Folding ADC," IEEE Journal of Solid–State Circuits, vol. 27, No. 12, Dec. 1992.

*Primary Examiner*—Brian Young
*Attorney, Agent, or Firm*—Carlton H. Hoel; W. James Brady; Frederick J. Telecky, Jr.

[57] ABSTRACT

In apparatus for digital processing to a sequence of numbers in binary format, each number is first converted to a base number and a residue number, the residue number being in a binary bit format. The processing is then performed using only the residue numbers. The digital processing is perfumed using binary addition, binary subtraction, and binary multiplication operations. After completion of the processing operation, the residue numbers are then converted into the original format. The folding analog-to-digital converter can be used to generate the residue binary bit numbers from an analog signal. This technique can reduce the apparatus required to perform such processing operations as FIR filtering and equalization.

12 Claims, 5 Drawing Sheets

APPARATUS AND METHOD FOR PROCESSING ANALOG SIGNALS USING RESIDUE-BASED DIGITAL OPERATIONS

This application claims priority under 35 USC § 119(*e*) (1) of provisional application number 60/048,950 filed Jun. 6, 1997.

BACKGROUND OF THE INVENTION

1. Field of the Invention

This invention relates generally to the processing of analog signals and, more particularly, to the processing to analog signal which have been converted to a digital representation. The particular digital representation used by the present invention involves the use of residue numbers derived from the analog signal of the full digital representation of a signal.

2. Description of the Related Art

It is known in the prior art to perform complex processing operations on digital signals by first converting the incoming analog signals to a digital representation and the performing the processing operations on the analogs signals in the digital representation. Referring for example to FIG. 1, a block diagram of an FIR (finite integer response) filter is shown. The INCOMING SIGNAL is applied to an analog/digital (A/D) converter 11 wherein the analog signal is divided into a series of sequential portions (i.e., in time) and each portion is converter to a sequence of digital signal representations. Each digital signal representation applied to filter unit 12 where the digital signal representation is transmitted through a series of delay lines 121. The sequential digital signal representation in each delay unit 121 is applied to a multiplier 122 wherein the digital signal representation stored in the coupled delay unit 121 is multiplied by a weighting factor. The output signal from each multiplier unit 122 is applied to a series of summation units 123. The output signal of each summation unit 123 is applied to the summation unit 123 coupled through a multiplier unit to the next sequential delay unit 121. The output signal of filter unit 12 can then be applied to a digital-to-analog converter unit 13 or can be used without conversion in further signal processing operations.

Referring to FIG. 3, an analog-to-digital converter unit 31 according to the prior art is shown. The digital-to-analog converter unit generates a digital binary output signal determined by the magnitude of the input signal. In this configuration, an ANALOG INPUT SIGNAL is applied to a series of comparator units 311. A second input terminal of the comparator units 311 receive a hierarchy of reference voltages determined in FIG. 3 by a series of resistors. The highest comparator activated by the ANALOG INPUT SIGNAL and applying a signal to the encoder unit 313 determines the DIGITAL OUTPUT SIGNAL.

When the typical normal digital representation is used, each arithmetic operation is implemented by a complex logic unit. And in many processing operations, such as that shown with the FIR filter, a large number of implementing units are required. Furthermore, the functions require a substantial amount of time to perform because of the possibility of carry bit propagation along a sequence of binary digits.

A need has therefore been felt for apparatus and a related method which would permit the implementation of arithmetic operations, for the digital processing of signals, which uses relatively simple apparatus and which does not include carry signal propagation along a series of binary numbers.

SUMMARY OF THE INVENTION

The aforementioned and other features are accomplished, according to the present invention, by using an analog-to-digital converter which provides a digital representation which completely specifies a number on the basis of residue components. In particular, the system used is generally referred to as the Chinese remainder numbers. Using these residues, not only can the number be specified by a sequence of relatively small (digital) numbers, but the arithmetic operations of addition, subtraction and multiplication can be performed using only the residue numbers, i.e., by the same set of base numbers.

These and other features of the present invention will be understood upon the reading of the following description in conjunction with the Figures.

BRIEF DESCRIPTION OF THE DRAWINGS

FIG. 7A is a schematic diagram of a folding analog-to-digital converter unit configured to provide a residue number according to the present invention, while

DESCRIPTION OF THE PREFERRED EMBODIMENT(S)

1. Detailed Description of the Drawings

Figure 1:
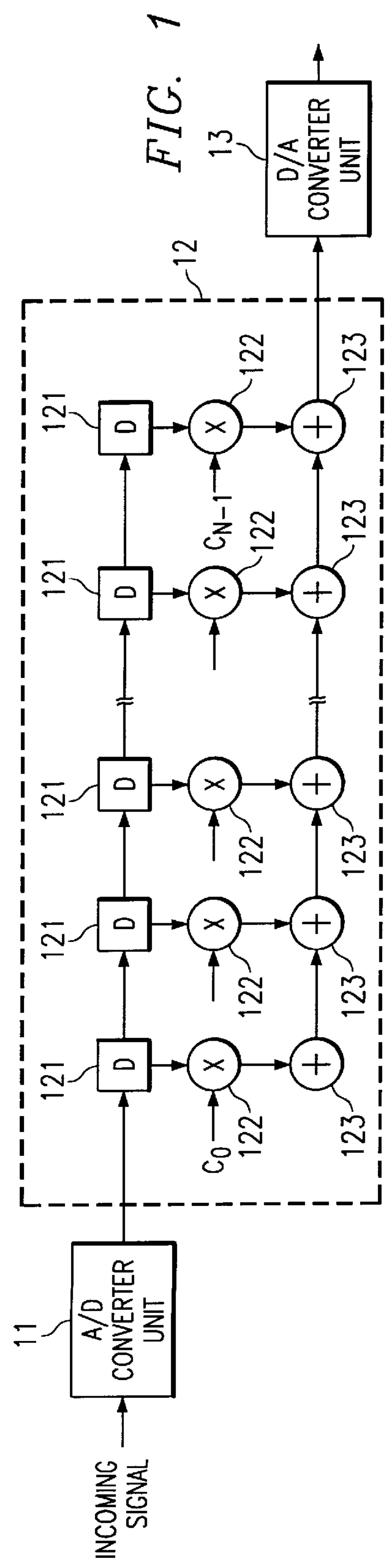
FIG. 1 is a block diagram of a FIR filter according to the prior art.
Figure 2:
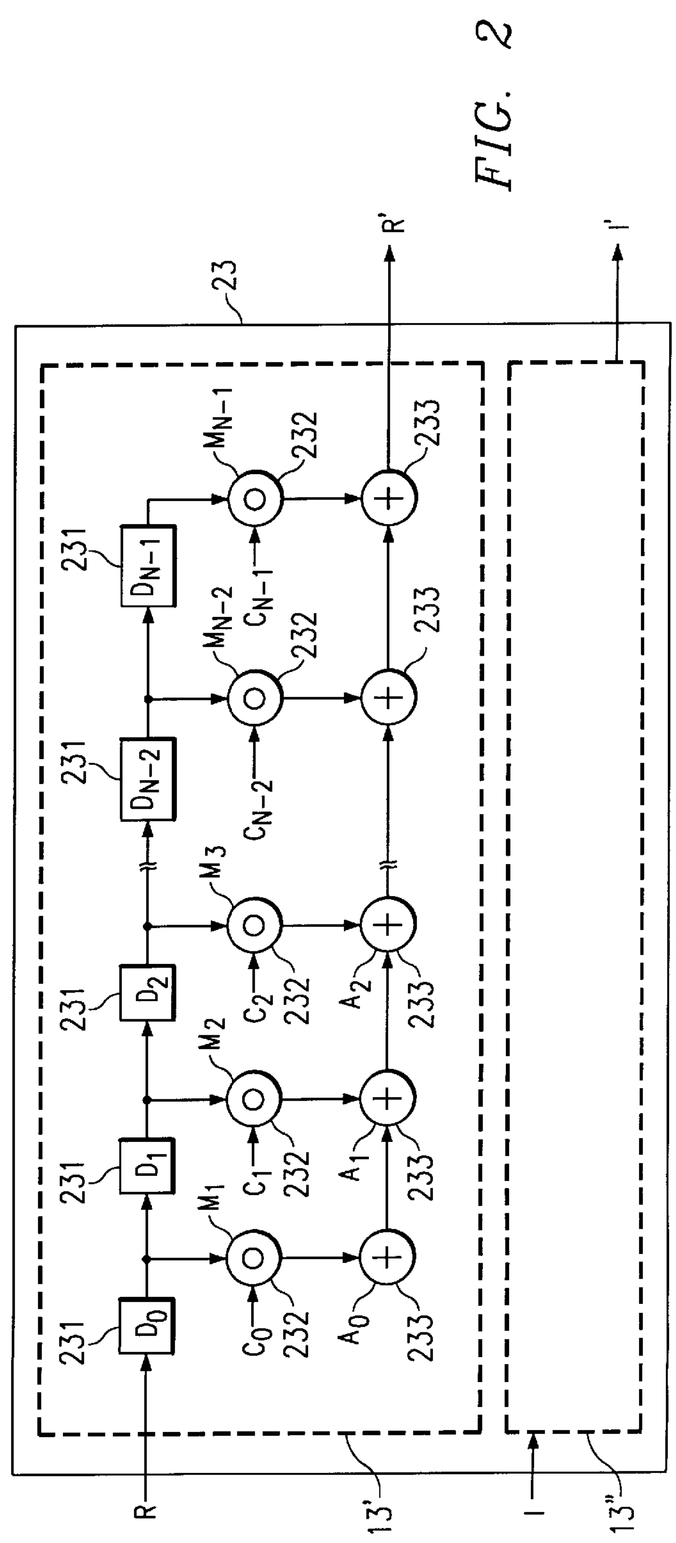
FIG. 2 is a block diagram of an equalizer according to the prior art.
Figure 3:
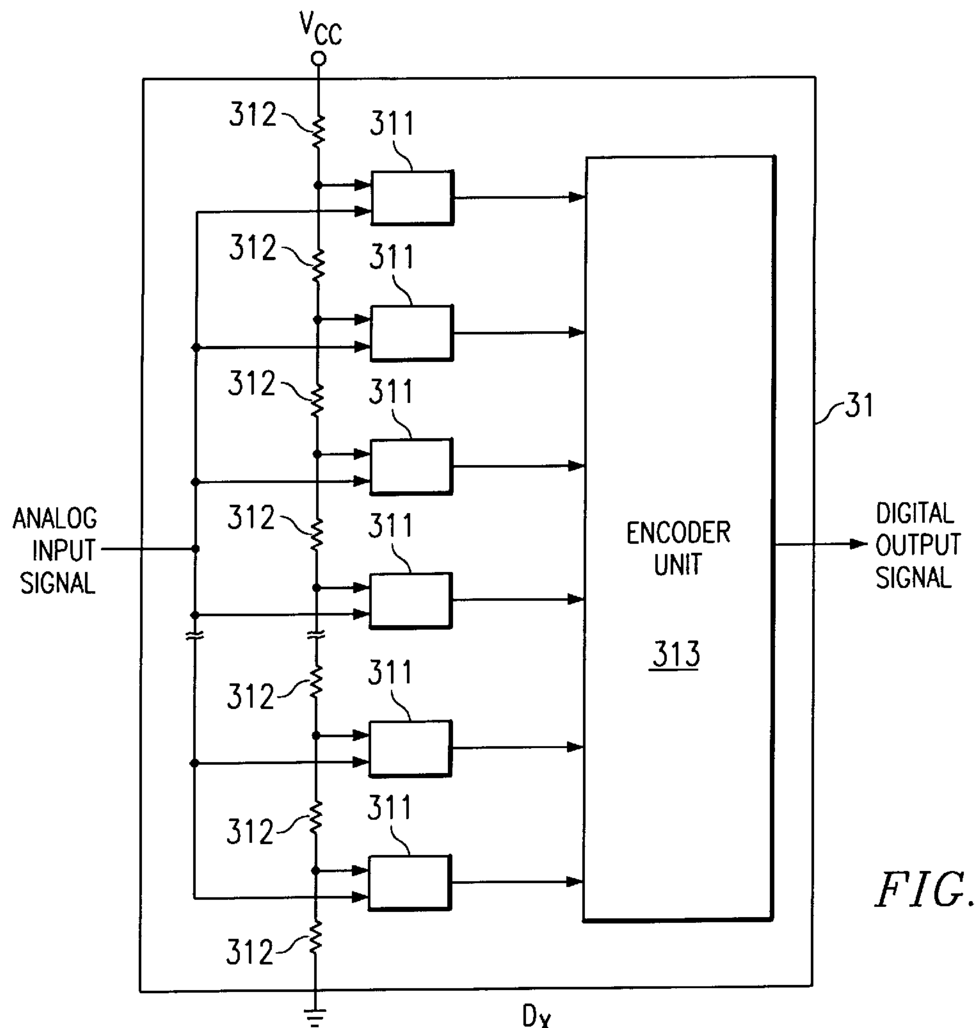
FIG. 3 is a schematic block diagram of an analog-to-digital converter unit according to the prior art.

FIGS. 1, 2, and 3 have been described with respect to the prior art.

The Chinese remainder number formalism uses a group of unrelated base numbers to generate a group of residue numbers. For example, using the prime numbers 3, 5, and 7, the related residue numbers for generated for the number 23 are (7×3+) 2, (4×5+) 3 and (3×7+) 2, i.e., {2, 3, 2}.

The Chinese remainder numbers have the property that the addition, subtraction and multiplication can be performed using only the residue numbers. For example, the related residue numbers for 11 are (3×3+) 2, (2×5+) 1, and (1×7+) 4, i.e., 2, 1, 4. Adding 23 and 11, 23+11=34. Adding the residue numbers {2, 3, 2}+{2, 1, 4}={4, 4, 6}={1, 4, 6}. The residue numbers for 34 are (11×3+) 1, (6×5+) 4, and (7×4+) 6 or {1, 4, 6}.

Figure 4:
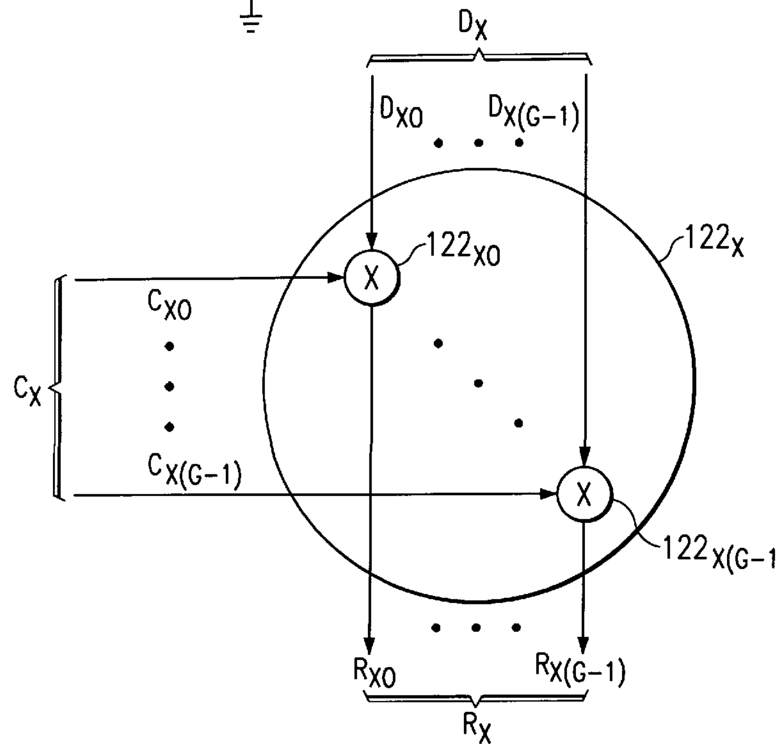
FIG. 4 is a schematic diagram of a component for performing an arithmetic operation according to the present invention.

The implementation of this technique is illustrated for a typical arithmetic element in FIG. 4. Referring to FIG. 1, a multiplier element $\mathbf{122}_X$ of the FIR filter unit of FIG. 1 has a signal $D_X$ from delay $\mathbf{121}_X$ and a constant signal $C_X$ applied to input terminals thereof. An result signal $R_X$ is generated by multiplier $\mathbf{122}_X$ and applied to adder unit $\mathbf{123}_X$. In the present invention, the $D_X$ signal is comprised of G residue signals $D_{X0}$ through $D_{X(G-1)}$. Similarly, the constant signal is comprised of G residue signals a $S_X$ through $S_{X(G-1)}$. The multiplier unit $122_X$ is comprised of G multiplier units, $122_{X0}$ through $122_{X(G-1)}$. The residues with the corresponding base numbers are applied to an associated multiplier unit. The result signal $R_X$ is therefore comprised of G result signals $R_{X0}$ through $R_{X(G-1)}$, each component result signal $R_{Xg}$ associated with a corresponding base number. It will be clear to those skilled in the art that number of component multiplier units can be reduced by multiplexing techniques. However, the use of multiplexing requires a longer time to execute the operation.

Figure 5:
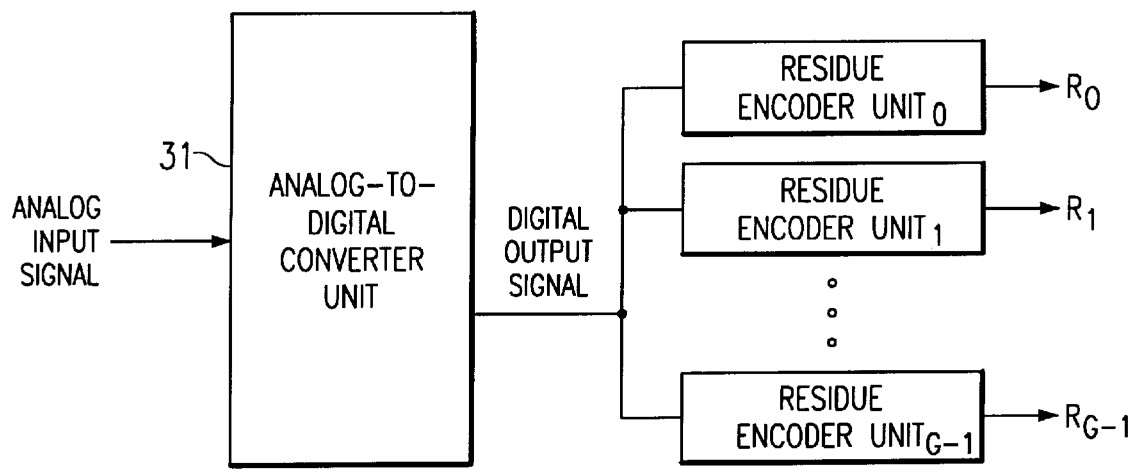
FIG. 5 is a schematic block diagram of a technique for generating the residue number using a typically-configured analog-to-digital converter unit.

Referring to FIG. 5, a schematic diagram of apparatus for generating residue numbers for a group G of base numbers is shown. In this technique, a typical analog-to-digital converter unit 31 generates a digital binary bit representation of the ANALOG INPUT SIGNAL. Then, residue decoder units generate the digital binary bit residue numbers R0 through $R_{(G-1)}$ for each of the G {i.e., 0–(G−1)} base numbers. For example, the residue encoder units can divide the DIGITAL OUTPUT SIGNAL by the base number g, the remainder being the base number.

Figure 6:
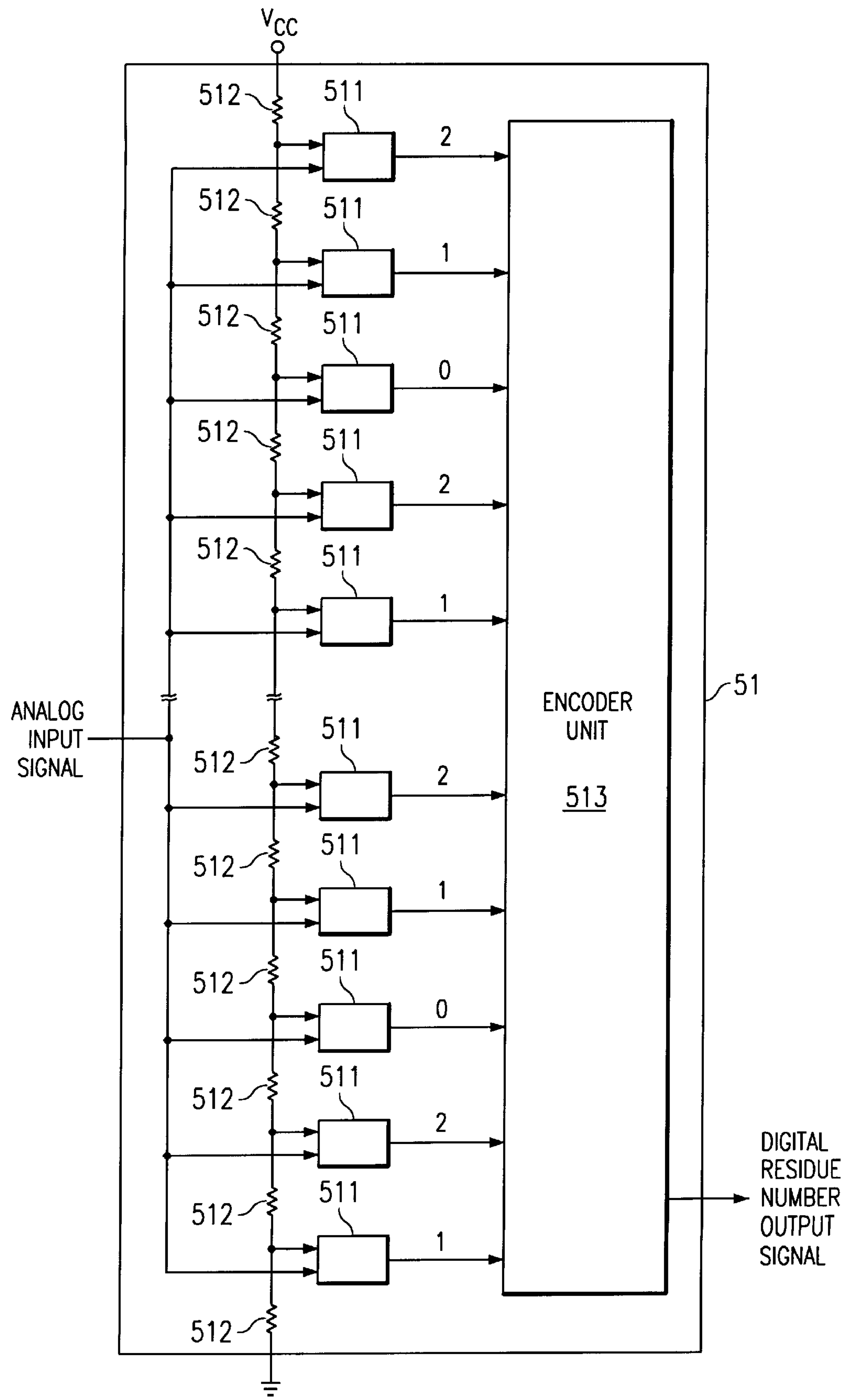
FIG. 6 is schematic block diagram of an typical analog-to-digital converter unit configured to provide a residue number according to the present invention.

Referring to FIG. 6, an analog-to-digital converter configured to provide residue signals directly is illustrated for the base number 3. Each comparator 511 is associated with a residue number (0, 1, or 2) for the base number 3. The encoder unit 513 identifies the comparator which is activated. The residue number associated with the highest activated comparator unit 511 is the residue number which is applied to the output terminal of encoder 513.

Figure 7A:
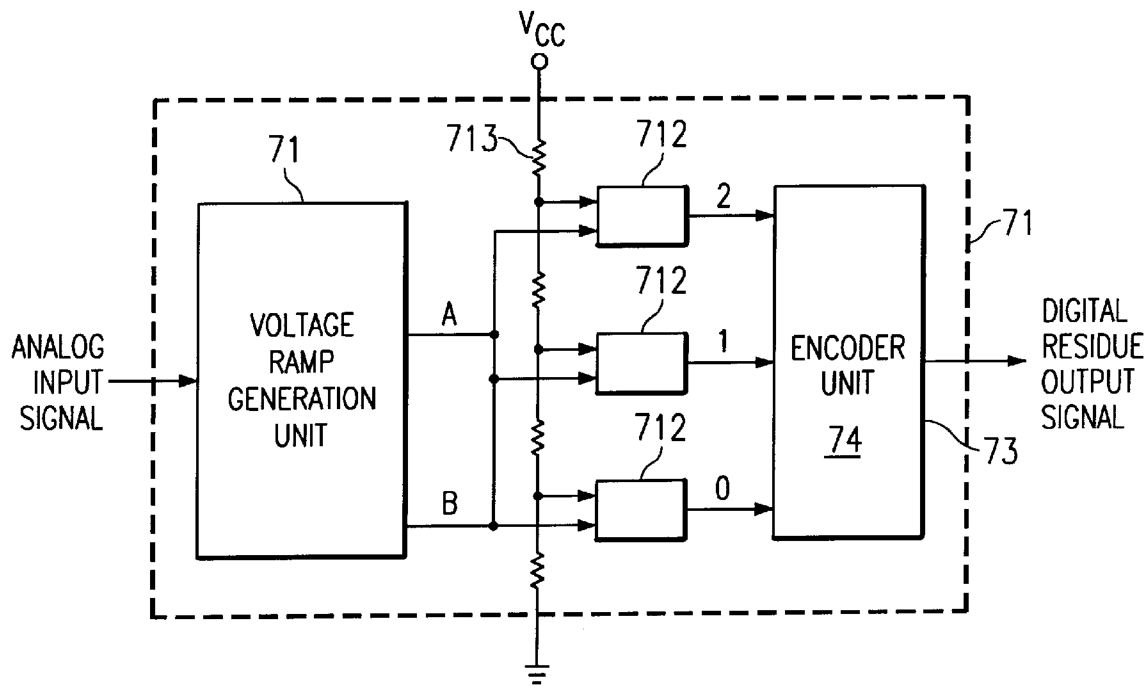
Figure 7B:
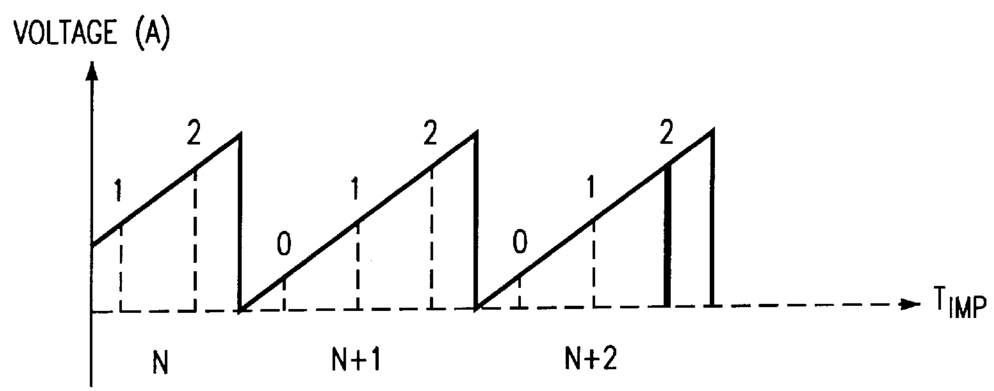
FIG. 7B illustrates a wave form associated with the analog-to-digital converter unit.

Referring to FIG. 7A, a folding analog-to-digital converter unit configured to generate residue numbers is shown. The analog-to-digital converter unit 71 implements the generation of binary residue for the base 3. The operation of a folding analog-to-digital converter can be generally understood if terminal A of the voltage ramp generation unit 71 generates a series of ramp-type voltage forms, such as illustrated in FIG. 7B, while terminal B generates a continuous ramp voltage wave form beginning at a negative value generally equal to the ANALOG INPUT VOLTAGE. Thus, the wave form of terminal A, as applied to comparator units 712, is a ramp wave form superimposed on a negative, but increasing ramp wave form. When the combination of the A terminal and B terminal wave forms becomes positive, at least one of the comparator applies a signal to the encoder unit 74. The comparator applying a signal to the encoder unit 74 and associated with the highest voltage identifies the residue number.

As will be clear to those skilled in the art of folding analog-to-digital converters, the ANALOG INPUT SIGNAL is specified, not only by the residue signal but by the number of ramp voltage wave forms generated by voltage ramp generation unit 71 on terminal A. For the present application, the number of ramp wave forms generated is not needed in the calculations. In the preferred embodiment, a folding analog-to-digital converter 71 is needed for each base number. However, the number of folding analog-to-digital converter units can be reduced by multiplexing techniques.

Figure 8:
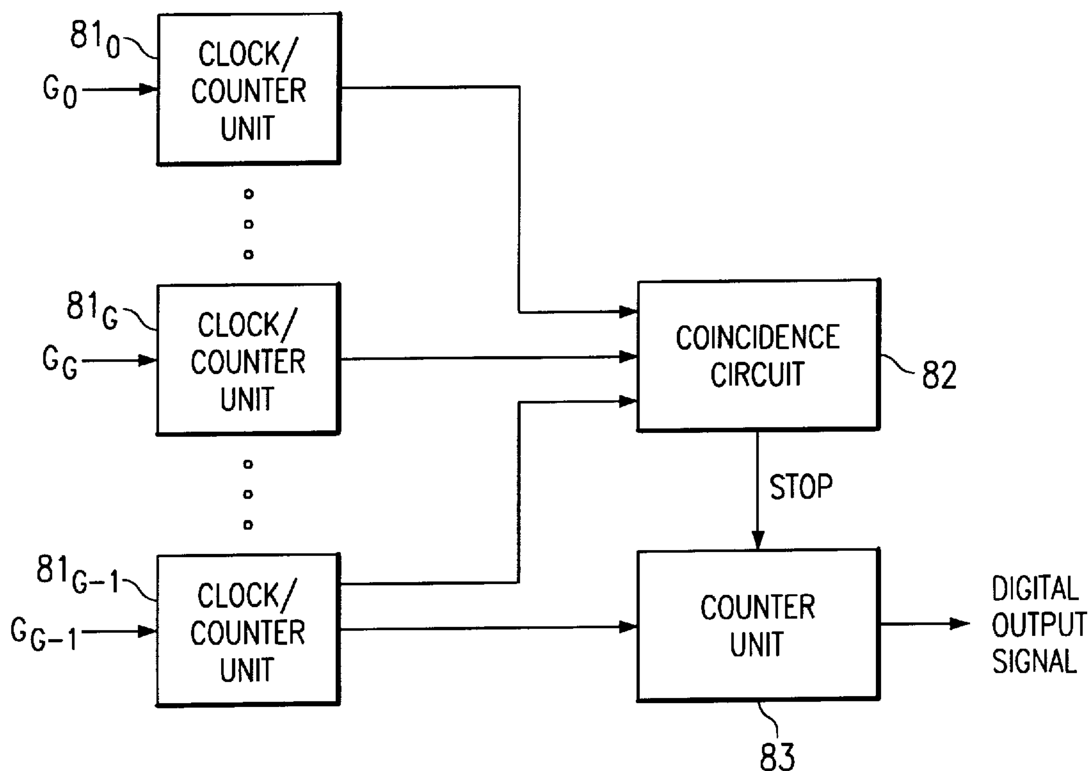
FIG. 8 illustrates a decoding scheme for providing a full binary number from residue binary numbers.

Referring to FIG. 8, apparatus for reconstructing the complete binary bit number from the digital residue number is shown. Each residue Gg is applied to a clock/counter circuit 81$g$. Each clock/counter circuit generates a pulse signal when each base number plus the residue is reached. The pulse signals are applied to a coincidence circuit. When all the clock/counter units 81$g$ generate pulse signals simultaneously, the coincidence circuit 82 generates a stop signal. The stop signal is applied to a binary counter unit 83. Counter unit 83 has the clock signals from one of the clock/counter units applied thereto. The stop signal stores the current count in the counter unit 83, the count being the complete binary bit number represented by the residue numbers. as This complete binary bit number is the DIGITAL OUTPUT SIGNAL.

2. Operation of the Preferred Embodiment(s)

The use of the group of residue numbers does not reduce the number of positions required to specify a number in binary notation. However, when the arithmetic operations are performed, in parallel, using the group of residue numbers instead of the using the full binary, the speed of arithmetic operations are greatly increased. Performing the arithmetic operations in parallel, however, requires a plurality of smaller functional units instead of a larger functional unit.

While the invention has been described with particular reference to the preferred embodiment, it will be under stood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A system for performing a processing operation on analog signals, said system comprising:

an analog-to-digital converter unit for providing a sequence of groups of residue numbers, each residue number derived from a base number; and digital processing apparatus having said sequence of groups of residue numbers applied thereto, said digital processing apparatus performing said processing operation on said sequence of residue numbers.

2. The system of claim 1 wherein said analog-to-digital converter unit includes:

an analog-to-digital converter for converting an analog signal to digital signal; and a plurality of residue encoder units for encoding said digital signals to a plurality of residue signals.

3. The system of claim 2 wherein said processing operation is selected from the group of processing operations consisting of addition, subtraction, and multiplication.

4. The system of claim 1 wherein said analog-to-digital converter unit includes:

a voltage ramp generator unit for generating a series of ramp output voltages, each ramp output voltage corresponding to an increasing series of ranges of analog input signals; and a comparison unit for determining when an analog input signal is equal to a ramp voltage in a one of said series of ranges.

5. The system of claim 4 wherein in said analog-to-digital converter unit includes a generation unit for generating a series of residue numbers determined by a magnitude of said analog input signal and a number of said plurality of ramp voltages required to correspond to said magnitude of said analog input voltages.

6. The system of claim 5 wherein said residure numbers are Chinese remainder numbers.

7. A method of processing an input analog signal to signal capable of being manipulated by a digital processing unit, said method comprising the step of:

converting said input analog signal to digital residue number signals.

8. The method of claim 7 wherein said converting step includes the step of:

converting said input analog signal to chinese remainder number signals.

9. The method of claim 8 wherein said converting step includes the steps:

dividing a comparator unit into a series of comparator subunits, each subunit related to a base number; and determining said chinese remainder number signals by the highest subunit and the highest level of said subunit activated.

10. The method of claim 8 wherein said converting step includes the steps of:

generating a series of ramp voltages, each ramp voltage related to a base number; and determining said chinese remainder numbers from a number of ramp voltages and a voltage level of a final ramp voltage, said final ramp voltage being identified by a comparator.

11. An analog-to-digital converter for converting an input analog signal to residue number digital signals, said converter comprising:

a comparator unit for determining a magnitude of said input signal relative to base number and a voltage level within said base number; and an encoder unit for converting said magnitude into said residue number digital signals.

12. The converter of claim 11 further comprising:

a ramp voltage generator, said ramp voltage generator providing a sequence of ramp voltage wave forms in response to said analog input signal, each ramp voltage wave form corresponding to a base number, wherein said comparator unit determines base number voltage level for said analog input signal, said encoder unit determining said chinese remainder number digital signals from a number of ramp voltage vwaveforms and from said base number voltage level.

* * * * *